United States Patent [19]

Scobey

[11] Patent Number: 5,525,199
[45] Date of Patent: Jun. 11, 1996

[54] LOW PRESSURE REACTIVE MAGNETRON SPUTTERING APPARATUS AND METHOD

[75] Inventor: Michael A. Scobey, Marlborough, Mass.

[73] Assignee: Optical Corporation of America, Garden Grove, Calif.

[21] Appl. No.: 300,741

[22] Filed: Sep. 2, 1994

Related U.S. Application Data

[63] Continuation-in-part of Ser. No. 791,773, Nov. 13, 1991.
[51] Int. Cl.$^6$ .................................................. C23C 14/34
[52] U.S. Cl. ........................... 204/192.26; 204/192.12; 204/298.19; 204/298.07; 204/298.26; 204/298.28
[58] Field of Search ..................... 204/192.12, 192.15, 204/192.26, 298.08, 298.07, 298.19, 298.26, 298.28

[56] References Cited

U.S. PATENT DOCUMENTS

| | | | |
|---|---|---|---|
| 3,461,054 | 8/1969 | Vratny | 204/192.12 X |
| 4,025,410 | 5/1977 | Stewart | 204/298.28 X |
| 4,572,842 | 2/1986 | Dietrich et al. | 204/298.07 X |
| 4,793,908 | 12/1988 | Scott et al. | 204/298.04 X |
| 4,885,070 | 12/1989 | Campbell et al. | 204/298.04 X |
| 4,923,585 | 5/1990 | Krauss et al. | 204/298.04 |
| 5,122,252 | 6/1992 | Latz et al. | 204/298.26 |
| 5,198,090 | 3/1993 | Galicki et al. | 204/298.28 X |
| 5,240,583 | 8/1993 | Ohonen | 204/298.04 |
| 5,281,321 | 1/1994 | Sturmer et al. | 204/298.04 |
| 5,286,360 | 2/1994 | Szczyrbowski et al. | 204/298.08 |
| 5,330,628 | 7/1994 | Demaray et al. | 204/192.3 X |

*Primary Examiner*—Nam Nguyen
*Attorney, Agent, or Firm*—Joseph R. Dwyer

[57] ABSTRACT

A method and apparatus for producing optical films on substrates having extremely high packing densities of the same quality as those films produced by ion beam sputtering including a vacuum chamber with a conventional magnetron sputtering system and unusually high speed vacuum pump means. The low pressure of inert gas created by said high speed vacuum pump means being in the range of $5 \times 10^{-5}$ Torr to $1.5 \times 10^{-4}$ Torr and the magnetron sputtering system being at least 16" from said substrates. A gas manifold around the magnetron and target material confines the inert working gas in the vicinity of the magnetron and as the gas diffuses and expands into the chamber the high speed vacuum pump means removes the expanded gas from the chamber at a high speed. An ion gun directs ionized reactant gas toward the substrates which has the effect of improving film stoichometry as well as reducing reactant gas at the magnetron. Multiple magnetron assemblies, multiple target materials and compound target materials may be used.

13 Claims, 5 Drawing Sheets

LOW PRESSURE REACTIVE MAGNETRON SPUTTERING APPARATUS AND METHOD

CROSS REFERENCE TO RELATED APPLICATION

This application is a continuation-in-part of application Ser. No. 07/791,773 filed Nov. 13, 1991 pending "Coatings" by Michael A. Scobey & Stanley L. Bryn.

BACKGROUND OF THE INVENTION

1. Field of Invention

The present invention is an improvement over the invention in application Ser. No. 07/791,773 and relates to a low pressure reactive magnetron sputtering apparatus and method for fabricating dielectric optical coatings on substrates. The difference between the invention in this application and the invention in the prior application is the surprisingly high quality of the coatings produced by this invention. The invention in the prior application was concerned with producing dense and stable coatings used for commercial bandpass filters and other types of optical coatings. The invention in this application deals with the specialized field of "low loss" coatings used for laser mirrors and output couplers. In these types of films, film scatter, absorption, and defects must be kept to a minimum. To date, the only known type of film process which has succeeded in this endeavor is Ion Beam Sputtering or IBS. IBS will be further explained hereinafter.

2. Prior Art

Optical coatings requiring very low levels of scatter and absorption have been traditionally manufactured using IBS. With this method, in a very high vacuum environment, a high energy ion beam in the energy range of 500 eV to 1500 eV is directed at a target (source) composed of desired coating materials. The effect of the ion bombardment is to sputter or remove atoms (species or particles) from the target due to momentum exchange in the target lattice. The sputtered species then condenses onto substrates. The pressure in the chamber is desired to be maintained at a very low level to prevent gas-phase collisions of the sputtered particles with background gases.

There is an extensive volume of references to reasons for the improved optical film performance that IBS provides over other coating techniques such as evaporation and other methods of sputtering.

Wei et al initially recognized the benefits of IBS for laser high reflectors in the U.S. Pat. No. Re 32,849 "Method of Fabricating Multi-layer Optical Films". In Wei et al, quarterwave stacks used for laser mirrors are produced using only a single ion gun illuminating a target. FIG. 1, which is a reproduction of FIG. 1 of Wei et al, shows an ion gun "A", target "B" and substrate "C". With this system, background levels of argon (inert gas) was kept at the extremely low pressure level of $1.5 \times 10^{-4}$ Torr. Reactive gas pressure (oxygen) was set to a level to insure proper stoichiometry of the depositing levels, in the range of $5 \times 10^{-5}$ Torr for high index materials and $3 \times 10^{-5}$ for low index materials.

Another IBS patent by Scott et al, No. 4,793,908 "Multiple Ion Source Method and Apparatus for Fabricating Multilayer Optical Films" uses the method of Wei et al with the addition of a second ion beam directed at the substrate which is partly composed of the required reactive species. The second ion beam provides improved optical properties. FIG. 2, which is a reproduction of FIG. 2 of Scott et al, shows ion gun "A", target "B", substrate "C" and the second ion gun "D". In this patent, Scott et al teaches that IBS is improved over conventional magnetron sputtering as the ". . . gas pressure in the chamber, e.g. at the substrate surface, using this approach can be in the tenths or hundreths of a millitorr range. This is a great advantage since the finished film tends to contain fewer gas atoms and have an improved range structure and atomic packing density." Col. 2 lines 14–19.

The films produced by the foregoing inventions have total losses as high reflector laser mirrors well less than 0.01% or 100 ppm.

"Loss" refers to everything other than reflection or Total loss=1-R where R=1-T-A-S and where R is reflection, T is transmission, A is absorption and S is scatter.

Vossen and Kern in the book "Thin Film Processes", Academic Press, New York 1978 at page 189 describe IBS as differing from other sputtering processes due to the fact that "low background pressure gives less gas incorporation and less scattering of sputtered particles on the way to the substrates." ("low background pressure"[sic] are in italics in the original). As discussed previously, this is of great advantage for depositing optical films.

Evaporation techniques, where the coating material is heated under vacuum to the point at which it evaporates, can also be accomplished at low coating pressures comparable to IBS. However, this technique does not impart nearly the kinetic energy of sputtering and the films tend to grow in a porous columnar manner. In addition, the process tends to eject small particles from the hot source due to small source explosions of source materials which can be caused by expanding trapped gases or differential heating. For these reasons, evaporation is used only for the production of relatively low tolerance coatings.

DC or magnetron sputtering has also been used to produce dielectric coatings for many low tolerance applications. In general, these methods involve filling a chamber with inert gas which is then ionized to form a low energy plasma. A target is then charged to a negative potential in the range of 400 to 900 volts which has the effect of bombarding the target with energetic charged ions and sputter atomic or molecular particles from the target. The sputtered particles then condense onto substrates. DC sputtering is used to sputter metals. RF sputtering utilizes oscillating target voltage with a net zero DC current to allow dielectric targets to be sputtered.

In the case of reactive DC sputtering, where reactive gas(es) are added to the chamber to form a compound film at the substrate, it is desired to have a reaction take place on the substrate and not the target, as a severe reduction in deposition rate as well as an increase in target arcing will take place when the target becomes covered with a reactive dielectric species. Many techniques in the prior art exist to cope with this problem, which are all some form of target and substrate isolation, where the reactive gas pressure at the target is maintained at a low level to prevent target "poisoning" and the reactive gas pressure is kept high at the substrate to effect reaction.

In the U.S. Pat. No. to Scobey etal No. 4,851,095 "Magnetron Sputtering Apparatus and Process" parts are shuttled on a high speed drum between a deposition zone maintained at a very high pressure of argon and a reaction zone containing an energetic reactive gas plasma.

The U.S. Pat. No. to Maniv et al 4,392,931 "Reactive Deposition Method and Apparatus" target material is sputtered through an orifice or aperture onto a rotating drum. Inert working gas is bled into the target chamber, and a reactive gas is bled into the rest of the chamber. The aperture limits the amount of reactive gas to the target. A field is established on the drum to ionize reactive gas and increase film transparency.

Scherer et al U.S. Pat. No. 4,931,169 "Apparatus for Coating A Substrate with Dielectrics" also discloses a sputtering through an orifice and producing an AC component to the DC drive voltage to prevent arcing. The AC field has the added effect of increasing rate due to an increase in collisions between oscillating electrons and the working gas. The field has the further effect of allowing a reduction in the coating pressure to as low as 0.5 Torr.

The U.S. Pat. No. to Dietrich et al 4,946,576 "Apparatus for the Application of Thin Layers to a Substrate" also discloses the use of an aperture between the cathode and the substrate and adds a positive voltage near the substrate over which the reactive gas flows. The reactive gas becomes ionized by the anode which has the effect of improving film stoichiometry. Another U.S. Pat. No. to Dietrich et al, 4,572,840 "Method and Apparatus for Reactive Vapor Deposition of Compounds of Metal and Semi-Conductors" uses a flow restriction between the magnetron and substrate equal to at least 40% of the cross-section of the space.

In all of the above cited prior art, the source to substrate distance is short. In Scobey et al, the distance is approximately 10 cm; in Maniv et al, the distance is 10 cm; in Scherer et al, the distance as 4 cm and Dietrich et al, '842, uses an example of 6 cm while Dietrich et al '576, does not list a distance but from the drawings it appears to be about 10 cm.

In addition, in all of the above cited prior art, the total pressure is maintained at conventional sputtering pressures of approximately $3\times10^{-3}$ Torr between the substrate and target, except for the Scherer et al.

Also, none of the magnetron sputtering systems cited above were capable of producing, or claimed the ability to produce, low loss optical coatings.

SUMMARY OF THE INVENTION

It is a primary object of this invention to produce optical films having extremely high packing densities, smooth surfaces and low scatter of equal or better quality as those films produced by IBS but in a DC magnetron sputtering system.

The method and apparatus which accomplishes this object includes a conventional magnetron sputtering system in a vacuum tank outfitted with an unusually high pumping speed vacuum pump. A gas manifold around the magnetron and target material confines the inert working gas (argon) in the vicinity of the magnetron. As the gas diffuses and expands from the area of the magnetron, the unusually high pumping speed vacuum removes the expanding gas from the chamber at a high speed. The pressure in the chamber is then a function of the pumping speed of the vacuum pump and the confinement efficiency of the magnetron baffle. Reactive gas enters the chamber through an ion gun which ionizes the gas and directs it toward the substrate. This has the effect of reducing the amount of gas required to provide the film with proper stoichiometry as well as reducing the reactive gas at the magnetron.

This invention distinguishes sharply from the known prior magnetron sputtering techniques and different from conventional ion beam techniques and is characterized by high vacuum chamber pressures preferably in the range of $5\times10^{-5}$ Torr to $1.5\times10^{-4}$ Torr with a long throw distance of 16" and longer and duplicates the process conditions of IBS (which operates in the same pressure range as described above) but using a DC magnetron sputtering system. This system, based on magnetron sputtering, improves the cost and throughput of depositing laser coatings dramatically.

DETAILED DESCRIPTION OF THE PREFERRED EMBODIMENT

Figure 1:
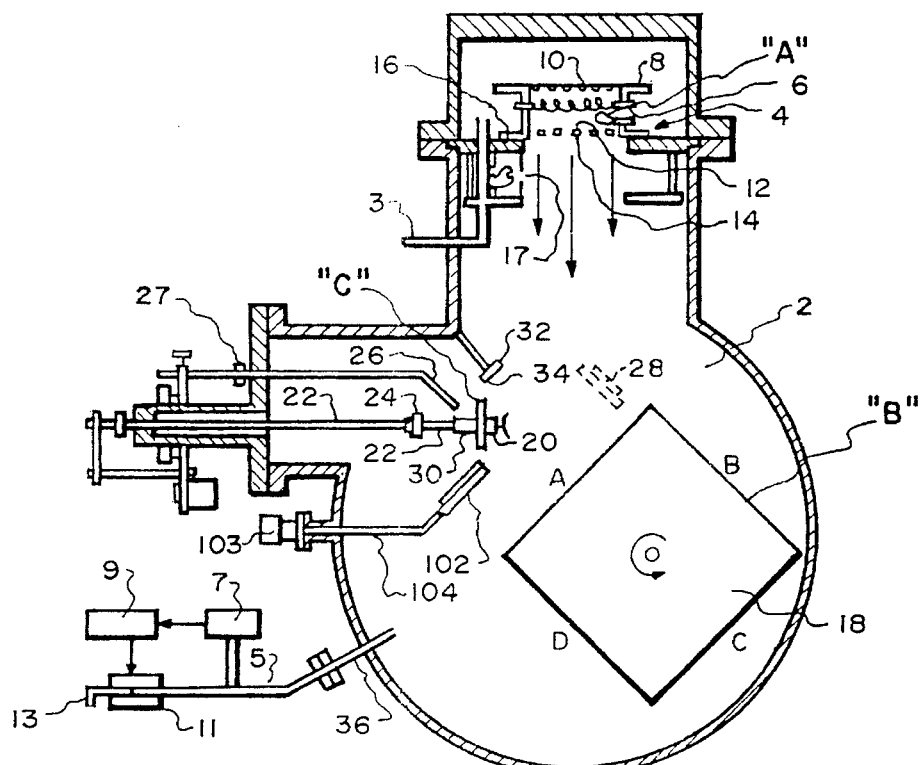
FIG. 1 is a reproduction of FIG. 1 of Wei et al as mentioned in the Background of the Invention.
Figure 2:
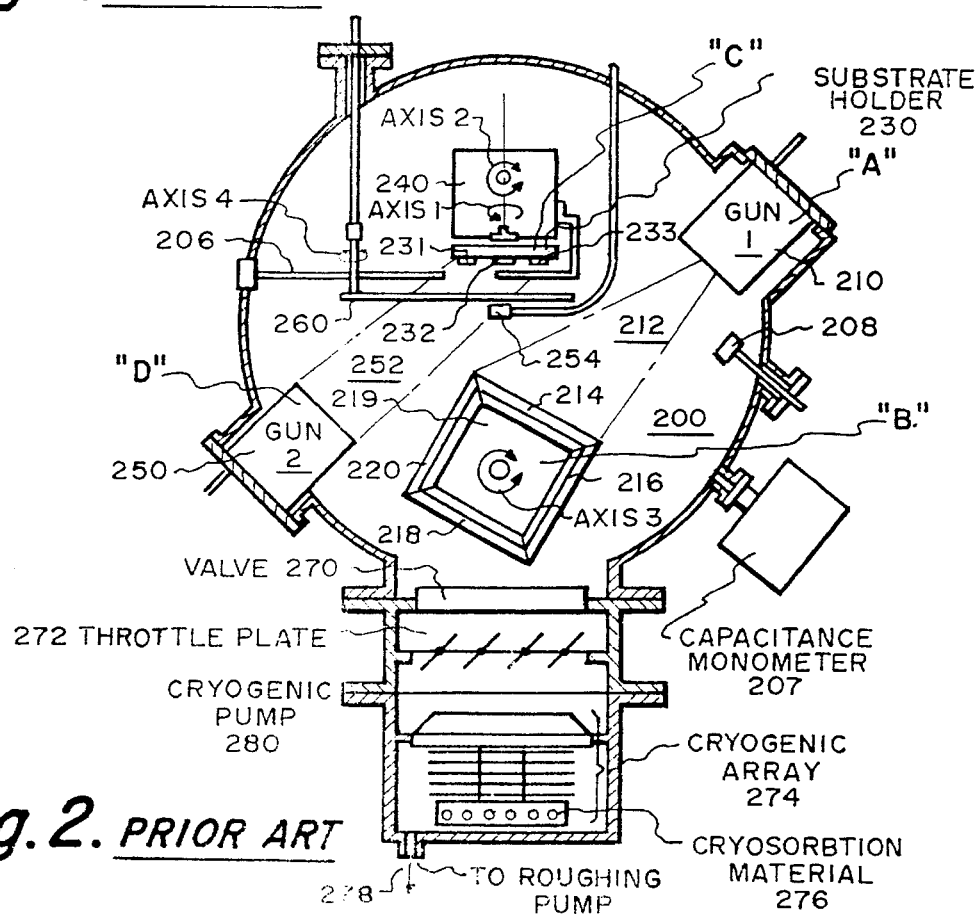
FIG. 2 is a reproduction of FIG. 2 of Scott et al as mentioned in the Background of the Invention.

As mentioned previously, FIGS. 1 and 2 show IBS systems capable of producing high quality dielectric coatings on substrates to form mirrors which are usable in ring laser gyroscopes. The present invention now being described is capable of producing the same high quality coatings but using a DC reactive magnetron sputtering system instead of IBS. Films made with this invention have identical properties to IBS coatings in that they have extremely high packing density, as well as smooth surfaces and low scatter. Total losses for a high reflector laser mirror are well less than 0.01% or 100 ppm. Background pressures of inert gas (argon) can be maintained at the same levels or lower in that disclosed in the Wei et al and Scott et al patents.

Figure 3:
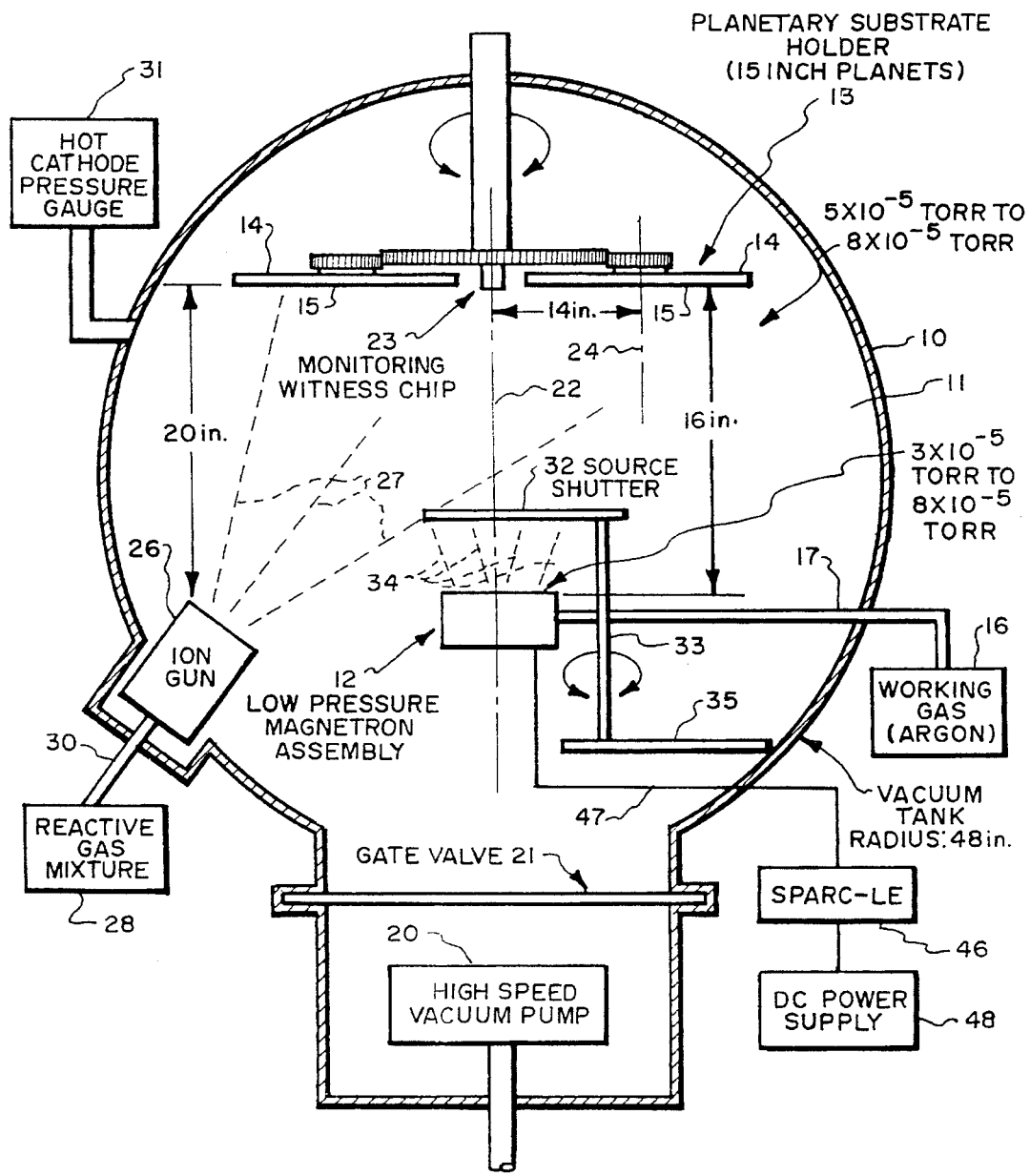
FIG. 3 is a cross-sectional schematic illustration of the apparatus of this invention.
Figure 4:
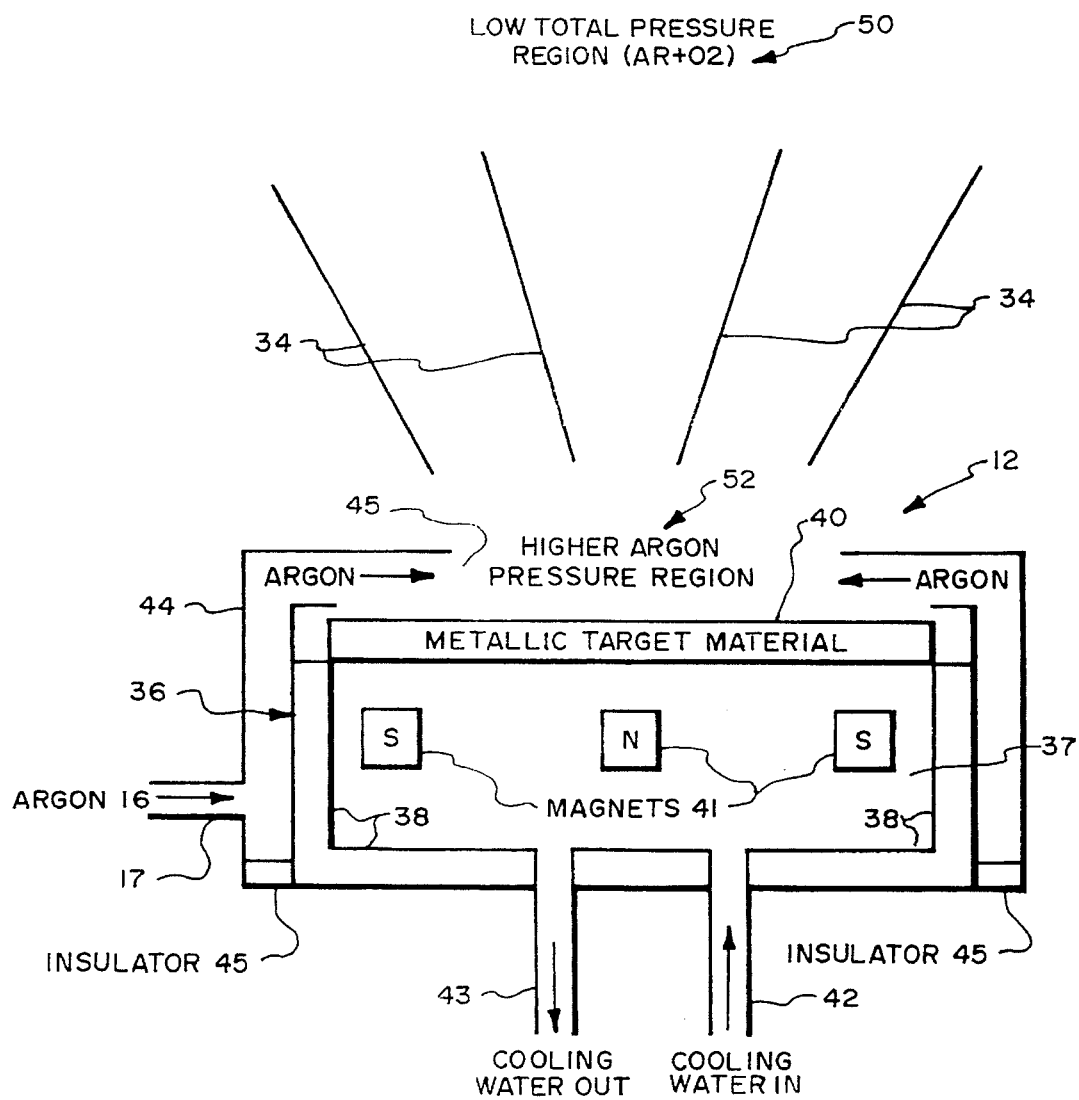
FIG. 4 is a schematic representation in cross-section of a magnetron sputtering apparatus of this invention.

FIGS. 3 and 4 show the method and apparatus of this invention. The housing 10 forms a vacuum chamber 11 containing a low pressure magnetron assembly 12 and a planetary substrate holder 13 with a plurality of rotatable planets 14. Each planet 14 holds a substrate facing the magnetron assembly 12. In this embodiment, the distance between the top of the magnetron assembly 12 and the planets is 16". The magnetron assembly 12 is connected to a source of working gas 16 by conduit 17. In this embodiment, the housing 10 is shown spherical with a radius of 48" but other configurations are equally appropriate.

The housing 10 has a lower sleeve 18 which opens into the vacuum chamber 11 and contains a high speed vacuum pump 20 with a gate valve 21 located between it and the vacuum chamber 11. The vacuum pump is of course used to lower and maintain the pressure in the vacuum chamber at a very low level in the inert gas pressure range of $5\times10^{-5}$ Torr to $1.5\times10^{-4}$ Torr.

Typical high speed vacuum pumps in this invention are 16" cryopumps or 16" diffusion pumps. Pumping speeds with these pumps are on the order of 5000 liters/second (nitrogen) for a 16" cryopump and 10000 liters/second for a 16" diffusion pump (ref. Leybold Product and Vacuum Technology reference book, 1993). Larger pumps can be used such as a 20" pump having pumping speeds of a 10000 liters/second for cryopumps (N2) and 17500 liters/second for diffusion pumps (N2) (ref. Varian Vacuum Products Catalogue 1991–92). Pumping speeds referenced above are at the throat of the pump.

The magnetron assembly 12 is in vertical alignment with the axis of rotation (main center line 22) of the planetary substrate holder 13 and with a holder for monitoring witness chip 23. In this embodiment, the throw or the distance between the top of the magnetron assembly and the planets is 16". Each planet and its substrate rotate about their own center line 24. Such planetary holders are conventional and need not be described further except to point out that, in this embodiment, the planets are 15" and the substrates are 15" or any size less than 15" in diameter and the center line of each planet is 14" from the center line 22 to accomodate large substrates.

An ion gun 26 whose output, represented by dashed lines 27, is directed obliquely toward the substrate holder 13 and whose input is connected to a source of reactive gas mixture 28 by conduit 30. The ion gun is positioned such that its output of ions and gas mixture cover the entire substrate holder 13 and in this embodiment the top of the ion gun is 20" from the planets. The principal function of the ion gun is twofold. The first is to modify and improve film properties in a manner similar in concept to the Scott et al patent. The second function may be more important, which is to serve to maintain low reactive gas background pressure. With the ion gun, reactive gas is ionized and directed toward the substrate(s). The momentum of the reactve gas then, carries it only toward the substrate(s) and not toward the magnetron, where it has the effect of causing arcing and rate reduction. The small amount of gas which diffuses toward the magnetron does not noticeably affect its operation. Typical reactive gas pressures are in the range of $3\times10^{-5}$ Torr to $8\times10^{-5}$ Torr.

A suitable hot cathode pressure gauge 31 is also connected to the vacuum chamber 11 to measure the pressure within the vacuum chamber. Also, vacuum chamber is provided with a shutter 32 oscillatible about a stem 33 blocking the output of the magnetron assembly 12, represented by dashed lines 34. The stem 33 is connected in any suitable manner to a platform 35 and to a means for oscillating the stem (not shown). The shutter is used to pre-sputter the sources to remove contaminates from the target which may have condensed while the apparatus was idle between layers being deposited on the substrate.

As shown in FIG. 4, the magnetron assembly 12 comprises a target holder 36 having a cavity 37 formed by walls 38 and target material 40. Centrally within the cavity 37 are conventional magnets 41 which are water cooled by the circulating flow of water in and out of the cavity 37 through passages 42 and 43. The metallic target material 40, clamped by the holder, also is water cooled. A manifold 44, spaced slightly from the holder 36, and sealed by insulators 45, is connected to the source of working gas 16 by conduit 17 (FIG. 3) which enables the gas to flow entirely around the top of the holder and over the metallic target material 40. The manifold 44 has an opening 45 substantially the size of the metallic target material so that sputtered target material and working gas is emitted as represented by the lines 34. The magnetron is available from Material Sciences of Boulder, Colo. and is typically 4" to 6" in diameter with high strength magnets.

When it is realized that this invention has the capability of producing laser quality mirrors by magnetron sputtering without the constraints of IBS as in the prior art, it should also be realized that this invention is a major departure from the prior art.

The foregoing dimensions and pressures of this embodiment—a throw of 16", 15" diameter planets, 15" or less diameter substrates and the distance of 20" from the top of the ion gun to the planets along with chamber pressures in the range of $5\times10^{-5}$ Torr to 1.5 to $10^{-4}$ Torr and sputtering pressures of $0.3\times10^{-3}$ Torr—also show the great difference between this invention and the prior art.

Compare also the throughput of this invention with the throughput of IBS in making laser quality mirrors;

|  | This Invention | IBS |
| --- | --- | --- |
| Coating Rate | 2–5A°/sec | .2–1A°/sec |
| Substrate Area (5 Planets) | 800–1200 in² | 50–100 in² |

From the foregoing it can be seen that the throughput of this invention is 20 to 120 times faster than the throughput of IBS. Coating throughput is a function of coating rate and substrate area.

Furthermore, the method of this invention scales easily to larger apparatus dimensions. All of the dimensions above can be easily increased at least by a factor of two to allow optics as large as 30" with laser quality coatings with good uniformity. Scaling is a simple linear issue. A larger system uses larger magnetrons and more process gas (argon). The vacuum pumps need to be increased to accomodate the larger chamber and the increase in process gas flow.

Thus, as is apparent, this invention is capable of producing laser quality mirrors which are many times greater in diameter than those made by IBS.

Figure 5:
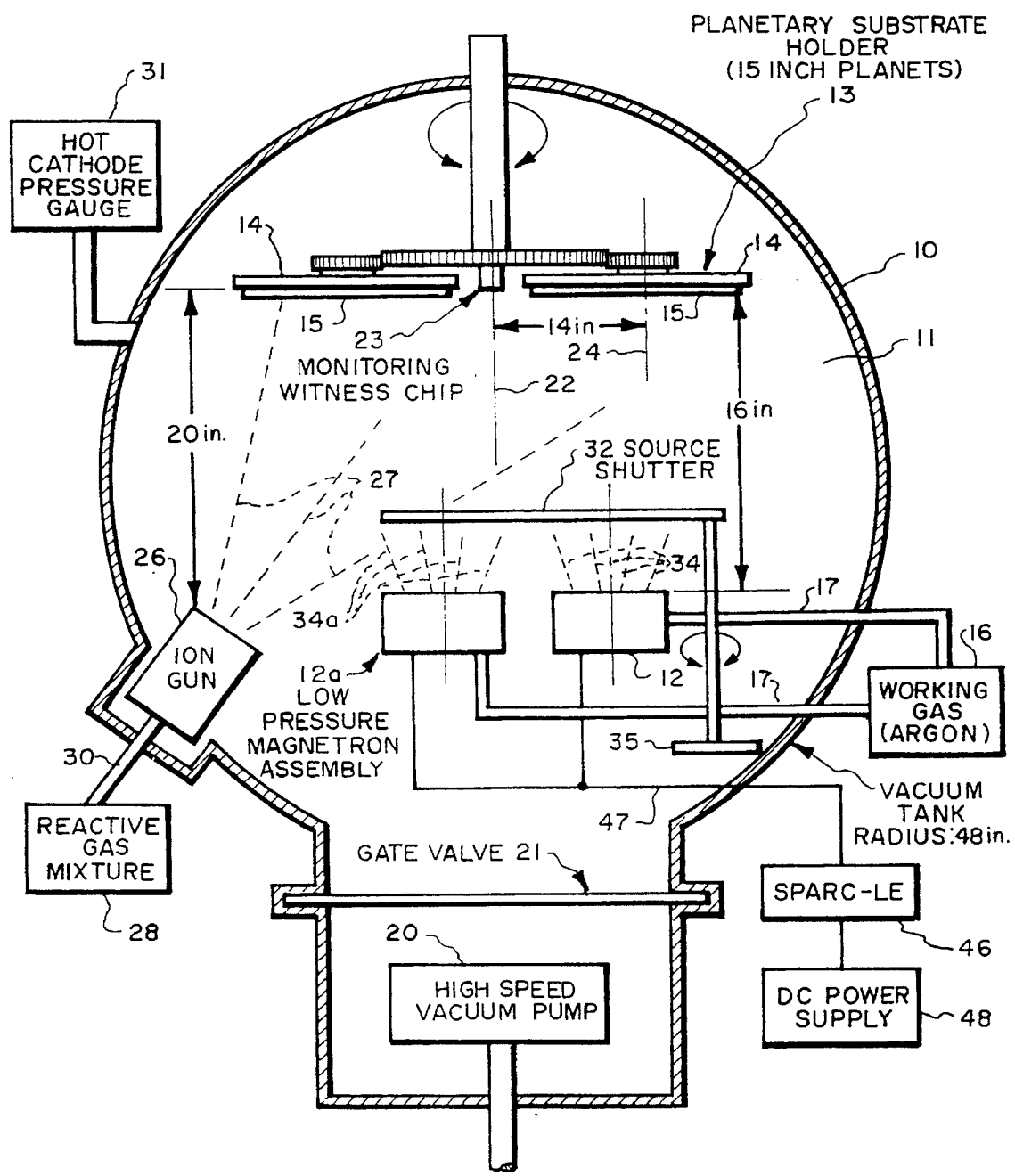
FIG. 5 is a cross-sectional schematic illustration of the apparatus of this invention with multiple magnetron sputtering assemblies.

The long throw of 16" and more and low deposition pressure in the range of $5\times10^{-5}$ Torr to $1.5\times10^{-4}$ Torr of this invention allows two or more materials to be concurrently deposited to form high optical films composed of mixtures of materials. FIG. 5 shows two sources, magnetron assembly 12 and magnetron assembly 12a in vacuum chamber 11 as an example of multiple sources. (The subscript to the added source and the use of all other reference numerals as in FIG. 3 are to simplify the description herein).

By controlling the level of power of each source which effectively controls the deposition rate, a layer of selected refractive index can be formed as a mixture of two or more materials. The mixtures can be homogenous throughout the layer to form a film of selected index, or inhomogenous where the layer composition and hence the refractive index varies throughout the film. One common form of inhomogenous film is called a "rugate" filter, where the refractive index varies in a sinusoidal manner which has the effect of forming a narrow notch reflector.

To maintain a low pressure for such a multi-source system, the pumping speed must be roughly increased by a factor of two for two concurrent deposition sources, or a factor of N for N sources. Adding pumping speed is a simple exercise of either increasing the size of the pump or adding more pumps to the chamber. In practice, however, two concurrent sources need not be powered as high of a level to maintain coating rate, as the rate from the sources is additive, and hence the sources can be sized to smaller levels which use less gas.

Another device which may be used in this invention is an arc reducing electronic device sold by Advanced Energy of Boulder, Colo. under the trademark SPARC-LE. In FIG. 3, the SPARC-LE 46 is shown connected to the magnetron assemblies 12 by an electrical conductor 47 with its own DC power supply 48. The SPARC-LE is connected similarly to the two magnetron assemblies 12 and 12a as shown in FIG. 5. Such a device helps in reducing arcing but it is not necessary in the method and apparatus of this invention.

From the foregoing, it can be appreciated that the magnetron system may operate at low pressures depending upon the type of magnetron but with the placement of the magnetron in a chamber whose pressure is much lower, the chamber pressure is decoupled from the magnetron pressure. Most importantly in this invention, the low total pressure region 50 ($AR+O_2$) is always much less than the higher argon pressure region 52 as depicted in FIG. 4.

Pressure in the chamber can be modeled using the well known pressure-flow equations (see Leybold Product & Technology Reference Book, page 18-5, 1993):

$$P_{Chamber} = Flow_{Ar}/C_p$$

$$P_{Magnetron} = Flow_{Ar}/C_M + P_{Chamber}$$

Where:

$P_{Chamber}$ is the pressure in the chamber $Flow_{Ar}$ is the flow of argon into the chamber (through the magnetron).

$C_p$ is the conductance of the high vacuum pump (chamber pumping speed).

$P_{Magnetron}$ is the pressure in the magnetron.

$C_M$ is the conductance due to gas confinement at the magnetron (confinement efficiency of the magnetron)

substituting terms, the chamber pressure can be written as:

$$P_{Chamber} = P_{Magnetron}/(C_p/C_M+1)$$

This is an important relationship because it shows that the pressure in the chamber is dependent upon the pumping speed of the chamber ($C_p$). It also shows that if the pumping speed of the chamber is low, then the pressure in the chamber is approximately equal to the pressure in the magnetron. This relationship is clearly in the prior art where throttle valve mechanisms are placed in front of the pump to reduce pumping speed. See Vossen and Kern, supra, at page 156. However, if the pumping speed in the chamber is large, as taught by this invention, then the chamber pressure becomes a small fraction of the magnetron pressure thereby decoupling the magnetron pressure from the pressure in the chamber.

Figure 6:
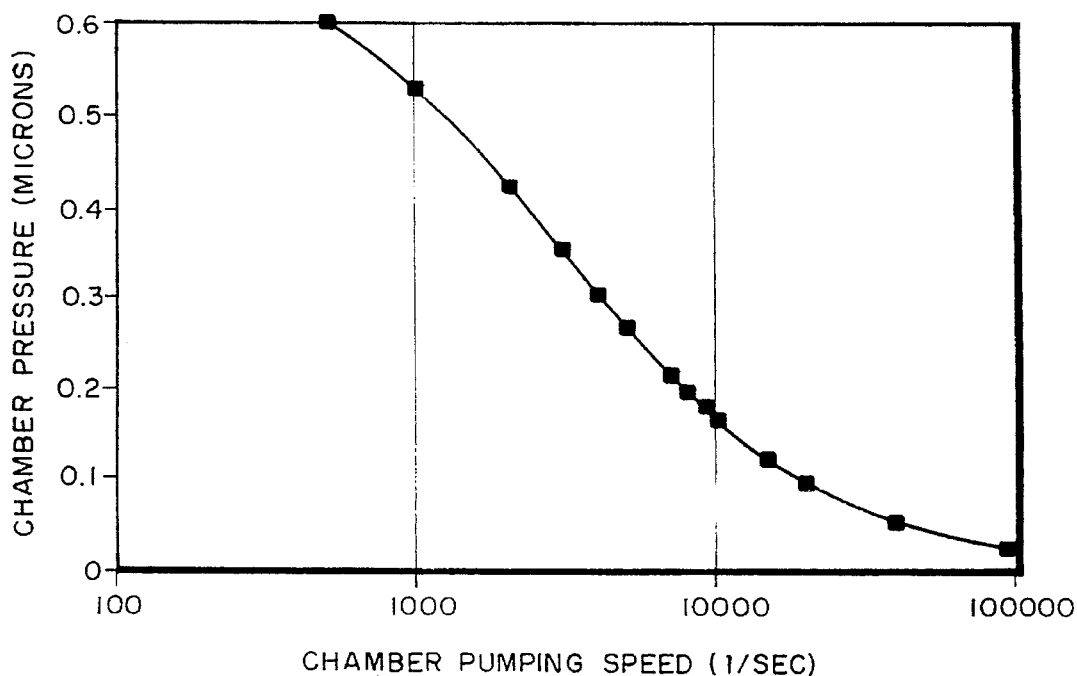
FIG. 6 is a graph showing the relationship between chamber pressure and chamber pumping speed assuming the magnetron pressure of 0.7 microns and a magnetron assembly conductance ($C_M$) of 3000 l/sec.
Figure 7:
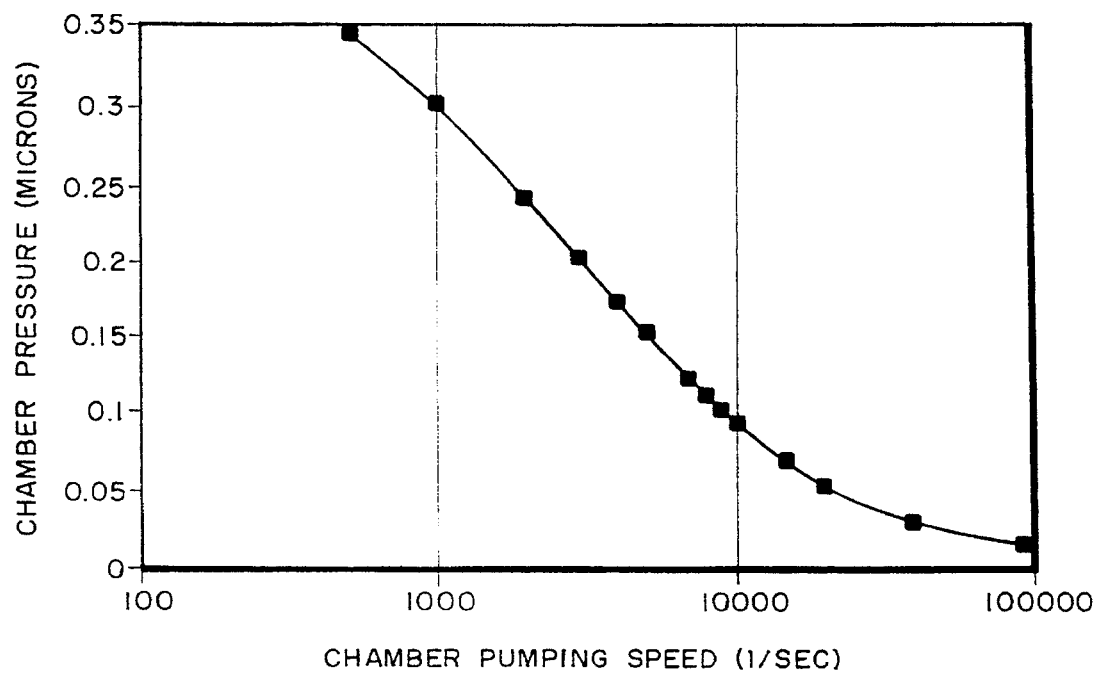
FIG. 7 is a graph showing the relationship between chamber pressure and chamber pumping speed assuming a magnetron pressure of 0.4 microns and a magnetron assembly conductance ($C_M$) of 3000 l/sec.

This relationship allows the pressure to be approximated for any new chamber with arbitrary pumping speed as shown in FIGS. 5 and 6. As is clearly evident from the figures shown, any arbitrary pressure can be achieved by increasing the pumping speed of the chamber. If the pressure in the magnetron can be dropped, possibly by improving magnets, the curve shifts down, as shown in FIG. 6 but the basic trend remains. The pumping speeds shown on the abscissa are quite achievable—for example, a commonly used 20" diffusion pump is rated at 17500 l/sec, and a 32" diffusion pump is rated at 32000 l/sec.

What is unexpected in the above relationship between pumping speeds and magnetron pressure is the quality of the coatings obtainable when this relationship is maintained by having the magnetron in the vacuum chamber and the substrate(s) at such a long throw distance from the magnetron.

I claim:

1. A method of depositing sputtered particles on substrates to form high quality thin film coatings comprising the steps of:

providing a vacuum chamber having magnetron means and source means for sputtered particles, providing means for positioning substrates in said chamber substantially spaced from but facing said source means to thereby define long throw distances, impinging said source means with inert gas at an impinging pressure confined to the vicinity of the magnetron means to sputter particles for coating the substrates which also allows some inert gas as well as sputtered particles to enter into the chamber at a pressure lower than said impinging pressure between the source and the substrates, connecting said chamber to a high speed high vacuum pump rapidly withdrawing and depleting said inert gas from the chamber by said pump by maintaining the inert gas pressure in said chamber in the range of $5 \times 10^{-5}$ Torr to $1.5 \times 10^{-4}$ Torr or less, and directing ionized reactant gas on to said substrates to facilitate reactive coating of said substrates, whereby low loss optical coatings are obtainable by the exceedingly low pressure in the chamber between said source and substrates and the long throw distances for the sputtered particles to travel to said substrates without inert gas interaction at the substrates.

2. The method as claimed in claim 1 including the further step in creating the long throw distances between the source and the substrates of at least 16".

3. The method as claimed in claim 2 further including the step of providing a manifold around said magnetron for the purpose of confining said inert gas around said magnetron yet allowing diffusion of sputtered particles to impinge upon said substrates.

4. The method as claimed in claim 3 wherein said source means is a compound source means for depositing compound sputtered particles on said substrates.

5. The method as claimed in claim 4 further including the step of providing a plurality of magnetrons for a plurality of sources of sputtered particles for depositing on said substrates.

6. The method as claimed in claim 5 including the further step of rotating said substrates with respect to said chamber.

7. An apparatus for magnetron sputtering to obtain a coating on a substrate for laser mirrors and output couplers comprising, means defining a vacuum chamber and having a magnetron system therein, target material in said magnetron system for the formation of sputtered particles, means creating a volume of inert gas adjacent said target material for forming said sputtered particles, said target material and inert gas being such that both sputtered particles and inert gas enter into said chamber, substrate positioning means in said chamber and spaced a substantial distance from said target material whereby the sputtered particles travel a long mean free path of at least 16" from target material to substrate, means for reducing and maintaining the pressure in said chamber in the range of $5 \times 10^{-5}$ Torr to $1.5 \times 10^{-4}$ Torr or less to reduce the interference between said sputtered particles and inert gas as the sputtered particles and inert gas travel said mean free path, and means for directing ionized reactant gas on said substrate.

8. The apparatus as claimed in claim 7 wherein said means for directing the ionized reactant gas comprises an ion gun.

9. The apparatus as claimed in claim 8 wherein a manifold surrounds said target material and having an opening into the vacuum chamber and facing said substrate.

10. The apparatus as claimed in claim 9 wherein said long mean free path of at least 16" permits substrates as large as 30" to be coated.

11. The apparatus as claimed in claim 10 further including an arc reduction means.

12. The method of depositing sputtered particles on substrates to form laser mirrors and output couplers comprising the steps of:

providing a vacuum chamber, positioning substrate means in said chamber, reducing the pressure in said chamber by high speed vacuum pump means having pumping speeds at least in the range of 2000 to 30000 liters per second to create a low inert gas pressure in said chamber in the range of $5 \times 10^{-5}$ Torr to $1.5 \times 10^{-4}$ Torr or less, placing magnetron system means with source means in said chamber at least 16" from said substrate means, introducing inert gas a pressure higher than the pressure in said chamber and confining said inert gas in the vicinity of said magnetron system means for sputtering particles from said source means, diffusing part of said inert gas and said sputtered particles into said chamber, removing said diffused inert gas and thus decoupling the diffused inert gas from said confined inert gas as a function of said pumping speeds of said pumps, and directing ionized reactant gas onto said substrate means.

13. The method as claimed in claim 12 wherein the ionized reactant gas pressure is in the range of $3 \times 10^{-5}$ Torr to $8 \times 10^{-5}$ Torr.

* * * * *